June 30, 1953 B. A. TREVOR 2,644,035

AUTOMATIC FREQUENCY CONTROL

Filed May 11, 1950 4 Sheets-Sheet 1

INVENTOR
Bertram A. Trevor
BY Harry Tunick
ATTORNEY

June 30, 1953 B. A. TREVOR 2,644,035

AUTOMATIC FREQUENCY CONTROL

Filed May 11, 1950 4 Sheets-Sheet 2

INVENTOR
Bertram A. Trevor
BY Harry Tunick
ATTORNEY

INVENTOR
Bertram A. Trevor
BY Harry Tunick
ATTORNEY

June 30, 1953 B. A. TREVOR 2,644,035

AUTOMATIC FREQUENCY CONTROL

Filed May 11, 1950

4 Sheets-Sheet 4

INVENTOR
Bertram A. Trevor
BY Harry Tunick
ATTORNEY

Patented June 30, 1953

2,644,035

UNITED STATES PATENT OFFICE 2,644,035

AUTOMATIC FREQUENCY CONTROL

Bertram A. Trevor, Riverhead, N. Y., assignor to Radio Corporation of America, a corporation of Delaware Application May 11, 1950, Serial No. 161,305

10 Claims. (Cl. 178—66)

This invention relates to automatic frequency control (AFC) of an oscillator. More particularly, it relates to a system for AFC of a heterodyne oscillator in a telegraphy receiver.

Generally, this invention operates to maintain proper receiver tuning when receiving on-off telegraph or frequency shift (FS) telegraph signals. Thus, the system of this invention is operative when receiving any of the following types of signals: on-off telegraph, on-off printer telegraph, FS telegraph, or amplitude, phase or frequency modulated telephone.

For on-off telegraph signals, continuous AFC of the receiver should be held as long as the signal is being keyed. Correction should be independent of keying bias or per cent mark. Also, the tuning correction should cease if the signal keying stops or if the signal goes off the air. Under these conditions, the receiver tuning should remain fixed for an indefinite time after the signal has disappeared. If it did not, the tuner might be driven outside its automatic control range at such times.

For on-off printer signals, continuous AFC of the receiver should be held as long as the signal is being received. Correction should be independent of keying bias or per cent mark. AFC should remain in effect as long as the signal is on the air, whether or not it is being keyed. On-off printer signals usually stop on the mark condition, which is equivalent to a continuous carrier. If the signal goes off the air the tuning correction should be inoperative. Under these conditions, the receiver tuning should remain fixed for an indefinite time after the signal has disappeared.

For FS telegraph signals, the center frequency between mark and space should be tuned to the center of the receiver selectivity. Also, the receiver tuning should be independent of per cent mark or keying bias. Further, such tuning should be independent of the amount of frequency shift. In some cases the AFC should become inoperative in the absence of keying, whether the signal stops on mark or space or any frequency between. In other cases the AFC should remain operative if the signal stops on mark. If desired, a carrier operated control may be used to disable the tuning mechanism after the signal goes off the air.

For phase, frequency or amplitude modulated telephony the tuning correction should be continuous. Also, it should become inoperative if the signal goes off the air. Under these conditions, the receiver tuning should remain fixed for an indefinite time after the signal has disappeared.

Accordingly, an object of this invention is to devise an arrangement meeting the above requirements.

More specifically, an object of this invention is to provide an AFC arrangement which will function continuously during reception of keyed signal but will be disabled when the received frequency shift keyed (FSK) signal is not being keyed or when it goes off the air.

Another object is to maintain AFC for an on-off keyed signal when on steady mark.

A further object is to squelch the AFC to prevent operation thereof by high receiver noise under weak signal or no signal conditions.

An additional object is to provide an improved motor control circuit for AFC.

The foregoing and other objects of the invention will be best understood from the following description of some examples thereof, reference being had to the accompanying drawings, wherein.

The objects of this invention are accomplished, briefly, in the following manner:

The output voltage of a discriminator controls the flow of alternating current to one winding of a two-phase motor, by means of an electronic circuit. The other winding of this motor is supplied with alternating current directly from the line. The motor drives a condenser in the heterodyne oscillator's circuit to tune such oscillator. In one embodiment, a relay is energized when keying stops or in the absence of signal to short-circuit the alternating current input to one winding of the motor. This in effect disables the AFC circuit. In another embodiment, a thresholding system biases off a tube supplying alternating current to the motor in response to the appearance of a weak signal or one that momentarily fades into the noise lever. An additional threshold circuit is provided to squelch the AFC when it might otherwise be enabled by the noise output of the discriminator.

Figure 1:
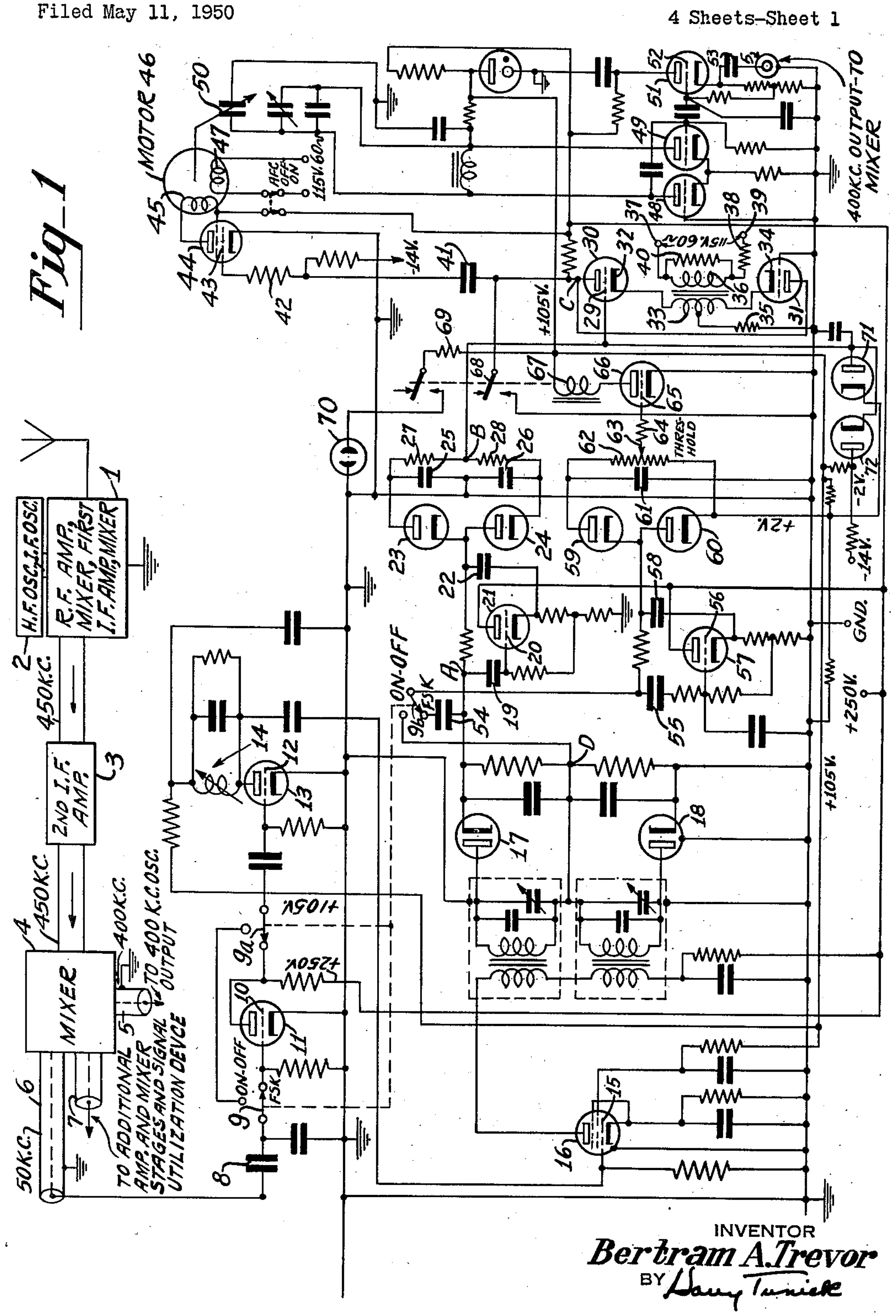
Fig. 1 is a schematic diagram of an AFC system according to this invention.

Now referring to Fig. 1, a single AFC circuit is shown. Actually, the AFC unit in a practical system would consist of three identical circuits as shown in this figure, one of which is operated in connection with each separate receiver of a three-set diversity system when separate beating oscillators are used. In case a beating oscillator common to all three sets is used, then only one AFC circuit would be required. For simplicity, this description will cover operation with a single receiver. The transmitted telegraph signals are picked up by an antenna and supplied to unit 1. This unit consists of a cascaded radio frequency amplifier, a mixer to which are also supplied oscillations from a high frequency oscillator in block 2, a first intermediate frequency amplifier, and another mixer to which are also supplied oscillations from an intermediate frequency oscillator in unit 2. The 450-kc. output of unit 1 is supplied to a second intermediate frequency amplifier 3. The 450-kc. output of amplifier 3 is supplied to a mixer 4 to which are also supplied, by means of coaxial cable 5, oscillations from a 400-kc. oscillator to be later described. The frequency of this 400-kc. oscillator is controlled by the AFC system of this invention. A portion of the output of mixer 4, which is to be maintained constant at 50 kc. is fed via line 6 to the AFC circuit to constitute the input signal thereof.

The rest of mixer 4's output is fed via line 7 to additional amplifier and mixer stages and a signal utilization device. Such utilization device may be any suitable device, such as a tone keyer, telegraph printer, etc.

The line 6 couples the 50 kc. input signal through a condenser 8, with switch 9 in the position shown, to the grid 10 of amplifier tube 11. The switch 9 in the "FSK" position shown, is utilized for FS reception. For FS reception, the 50 kc. signal is amplified by tube 11. It is then applied through switch *9a* (ganged with switch 9) and a coupling condenser to the grid 12 of tube 13. Tube 13 functions as a limiter by virtue of current saturation and grid limiting in the presence of large inputs from tube 11. The output of tube 13 is coupled over a tuned circuit arrangement 14 to the grid 15 of tube 16.

Tube 16 is a discriminator driver which drives diodes 17 and 18 connected in a Crosby or double-tuned-type discriminator circuit. The cathode of diode 18 is connected to ground. The discriminator 17, 18, etc. is driven by tube 16, the tuned circuits driving rectifiers 17 and 18. The upper tuned circuit resonates at 48 kc. and the bottom circuit resonates at 52 kc. With 50 kc. input to tube 16, both circuits drive the top and bottom diodes 17, 18 with equal voltages. This makes point D (between the two output resistors) negative with respect to ground and point A at ground potential. A slight change in frequency will still leave point D negative, but point A will go positive or negative for a lower or higher frequency input, respectively.

For FS input signals to the discriminator, D. C. keying is delivered at point A or the cathode of diode 17. If the mark and space frequencies are equally disposed about the discriminator center frequency, the keying at point A will have equal excursions plus and minus with respect to a base value or ground. The D. C. keying at point A is coupled through condenser 19 to the grid 20 of a cathode follower driver tube 21. The excursions at point A are coupled from the cathode of tube 21 through condenser 22 to the cathode of a diode 23 and the anode of a diode 24. The resistor between point A and the cathode of diode 23 does not appreciably drive the diodes 23, 24, due to the low output impedance of the cathode follower 21. This resistor will pass a steady direct potential, held for a long time, on to the diodes 23, 24 and finally to point B at the output side of such diodes. The diodes 23 and 24 are connected to function as a peak-to-peak diode rectifier or diode voltmeter. For this purpose, a long time constant RC load, consisting of two series capacitors 25 and 26 in parallel with two series resistors 27 and 28, is connected between the anode of diode 23 and the cathode of diode 24. Capacitors 25 and 26 may be of one microfarad and resistors 27 and 28 of 2.2 megohms. Since the cathode follower driver 21 functions as a low impedance source, diodes 23 and 24 serve more accurately as a peak voltmeter. It will be noted that the diodes 23 and 24 are connected in a more or less conventional voltage doubler circuit.

The excursions at point A are rectified by the peak-to-peak diode rectifier including diodes 23 and 24. Under these conditions (equal excursions with respect to ground at A), point B (between resistors 27 and 28) will be maintained at ground potential irrespective of keying bias or per cent mark in the received signal. This is so because the peak-to-peak diode circuit 23, 24, etc. maintains equal and opposite potentials across the two capacitors 25 and 26. Each such potential is equal to the peak value of the mark and space excursions of point A.

If the receiver tuning drifts, the mark and space frequencies at lead 6 will be unequally displaced from the discriminator center frequency. This will cause a corresponding shift in one direction, from zero, of the D. C. potential at B under keyed conditions. Likewise, a drift in the opposite direction will cause the potential at B to shift in the opposite direction. Also, for a steady carrier input to tube 16, having a frequency different from 50 kc., changes in the voltage at point A will be carried through diodes 23 and 24 to point B via the resistor joining capacitors 19 and 22 at point A.

Point B is connected to grid 29 of triode 30 the plate of which is connected to the plate of a similar triode 31. The grid of triode 31 is grounded. The potential of B is used to control the balanced triodes 30 and 31. Cathode 32 of tube 30 is connected to one end of a transformer secondary 33, while cathode 34 of tube 31 is connected to the other end of winding 33. The midpoint of winding 33 is connected to ground through a resistor 35. One end of the transformer primary 36 coupled to winding 33, is connected to a terminal 37. The other end of winding 36 is connected through a resistor 38 to a terminal 39. A resistor 40 is connected across winding 36. Between terminals 37 and 39 is applied a suitable source of alternating voltage. In this way, the balanced triodes 30 and 31 have supplied to their cathodes a push-pull 60-cycle voltage. Since the anodes of 30 and 31 are connected together, no 60-cycle appears at common anode point C when the two triodes have equal D. C. grid potentials. This may be termed the balanced condition.

Point C is connected through a condenser 41 and a resistor 42 to the control grid 43 of amplifier tube 44. One winding 45 of a two-phase tuning motor 46 is connected in the plate circuit of tube 44. With proper receiver tuning, point B will be at ground or zero potential, as previously described. If the receiver tuning drifts, the potential at B will vary from zero in one direction or the other, corresponding to the direction of drift. With proper receiver tuning, the mark and space frequencies at the input of discriminator 17, 18 will be equally disposed about the discriminator center frequency. When the potential at B varies in one direction from the balanced condition (zero or ground potential thereat) a 60-cycle voltage appears at point C and at the grid 43. If the potential at B varies in the other direction from balance, the 60-cycle voltage at grid 43 appears in opposite polarity, or in opposite relative phase. Tube 44 amplifies this 60-cycle voltage and supplies it to motor winding 45. The other winding 47 of motor 46 is supplied directly from the 60-cycle line. In this way, motor 46 is energized and driven when the potential at B varies from zero.

The network 38, 40 serves to give a total phase shift of ± 90° to the voltage appearing at the plate of tube 44, relative to that on the 60-cycle line. This provides proper conditions for running the two-phase motor 46.

Tubes 48 and 49 are connected to serve as a 400-kc. oscillator. These tubes are connected in a cathode-coupled type oscillator circuit. The frequency of this oscillator is controlled by tuning motor 46 through the agency of a variable condenser 50 connected into the oscillatory circuit of such oscillator and mechanically coupled to the motor shaft through suitable gearing. The oscillator frequency is varied whenever motor 46 is energized.

Tube 51 is connected as a cathode follower having its grid 52 coupled to the oscillator output. This tube supplies oscillator output through condenser 53 to the coaxial cable 5 previously referred to, which feeds 400-kc. heterodyning energy to mixer 4 to heterodyne the 450-kc. energy therein to a frequency of 50 kc.

The foregoing description has described operation of the AFC system under FS keying conditions. Normal tuning for FS keying requires that the mark and space frequencies be equally spaced about 50 kc. To accomplish this result, a disabling circuit for the AFC system is required, the disabling coming into effect in the absence of keying, whether the signal stops on mark or space. Without such disabling, the AFC circuit would tune either the mark or space signal to exactly 50 kc. Such action cannot be permitted. Such a disabling circuit will now be described.

Under FS keying conditions, the D. C. keying at point A is fed through a switch 9b (ganged with switch 9) and through coupling condensers 54 and 55 to the grid 56 of a cathode follower driver tube 57. The excursions at point A are coupled from the cathode of tube 57 through condenser 58 to the cathode of a diode 59 and the anode of a diode 60.

The high resistance between the upper plates of condensers 55 and 58 cannot drive diodes 59, 60 due to the low output impedance of the cathode follower 57. The diodes 59 and 60 are connected quite similarly to diodes 23 and 24 previously described, to function as a peak voltmeter or voltage doubling rectifier. Here, however, the second condenser is capacitor 58, connected between the output of the low impedance drive tube 57 and the anode of diode 60 and cathode of diode 59. The cathode of diode 60 is connected to a low impedance source of +2 volts and hence is not driven by alternating current. A capacitor 61 is connected from the anode of diode 59 to ground, and a potentiometric resistor 62 is connected from the anode of diode 59 to the cathode of diode 60. Cathode follower driver 57 functions as a low impedance source driving rectifiers 59 and 60, making them more accurately a peak voltmeter or voltage doubler.

Under FSK conditions, the D. C. keying at A is fed to rectifiers 59, 60, developing a negative potential at the movable tap 63 on resistor 62. Tap 63 is adjusted along resistor 62 to obtain the desired negative potential. This negative potential at tap 63 is applied through resistor 64 to the grid 65 of a triode 66. Such negative potential keeps tube 66 in a nonconducting condition. The winding 67 of a relay designated generally by 68 is in series in the plate circuit of tube 66. In the presence of keying, rectifiers 59, 60 produce a negative voltage at grid 65 of sufficient magnitude to cause tube 66 to be nonconducting, releasing the relay to the position shown. In such position, two circuits are opened. The long time constant of the 5-megohm resistor 62 and 0.1 microfarad capacitor 61 in the output of rectifiers 59, 60 maintains this negative voltage nearly constant at grid 65 during keying. This keeps relay 68 in the unoperated condition.

If keying stops, a steady D. C. potential is developed at point A. Such potential cannot be transmitted through capacitor 54. Under these conditions, then, rectifiers 59 and 60 receive no input. The cathode of diode 60 is returned to a +2 volt source to overcome contact potential of the diode, such that in the absence of keying the grid potential of tube 66 will be zero or slightly positive with respect to ground. This insures that tube 66 will positively energize the relay in the absence of keying.

This grid potential on grid 65 makes tube 66 conducting, thus energizing winding 67 of the relay. When relay 68 is energized, the lower contact thereof short-circuits the 60-cycle input to grid 43 by connecting point C directly to ground through such contact. The circuit for this is obvious. The upper contact of relay 68 now completes a circuit as follows: 105-volt source, resistor 69, neon lamp 70, ground. This will light the warning neon lamp 70.

When relay 68 is energized, therefore, motor 46 will not run because the winding 45 is not energized. Thus, the tuning of oscillator 48, 49 remains fixed at its most recent frequency as long as keying is absent. As long as keying is absent, the potential at A is steady D. C. and relay 68 remains energized. Thus, in the absence of telegraph signals at the input 6, the AFC apparatus is disabled.

For on-off, on-off printer or telephony signals, it is desirable to omit the limiting action as provided with FS keying. This is accomplished by throwing the three-ganged switch 9, 9*a*, 9*b* to the upper position labeled "on-off." The tube 11 is then cut out of the circuit and the 50-kc. input is applied at low level to the grid 12 of tube 13. Tube 13 does not limit under this condition. If limiting were used, during on-off "space" the noise would rise to a high level. We need to distinguish between "signal on" and "signal off."

If the input signal is on-off keyed at exactly 50 kc., no keying occurs at point A since such point is then at ground potential either with or without input signal. With proper tuning (no keying at point A), there is a zero potential at point B and the tuning motor 46 is not energized. A slight error in the input frequency due to receiver drift will produce the same on-off keying voltage at A with a polarity depending on the direction of the frequency error. The time constant circuits 25—28 smooth out this keying to give a nearly steady D. C. voltage at B. This will affect tube 30 to energize motor winding 45. Motor 46 will then rotate to tune oscillator 48, 49 in a direction to counteract the original drift. This will provide AFC action.

It will be seen, from the foregoing, that the

AFC action always goes from point A through tubes 23, 24 to tube 30 for all types of keying.

If the input signal is on-off keying, even though it be at exactly 50 kc., keying appears at point D. Point D is then keyed negatively with respect to ground. With switch 9*b* in the on-off position, the keyed direct potential at point D is fed directly to the cathode follower driver tube 57. From there it is fed to rectifiers 59, 60 in turn coupled to tube 66. With carrier present in the discriminator 17, 18 etc., the potential at D is negative with respect to ground. This negative potential keeps tube 66 cut off, de-energizing relay 68 and allowing the tuning motor 46 to be operated. Thus, AFC is maintained with carrier present. If the carrier disappears, the potential at point D disappears also. This brings grid 65 to a substantially zero or ground potential, causing tube 66 to conduct. The relay 68 is now energized to disable the AFC apparatus, rendering the tuning motor 46 inoperative and lighting lamp 70.

Diode clamps 71 and 72 are connected to the control grid 29 to keep the potential at this point from going too far in either direction from ground potential. The anode of diode 71 and the cathode of diode 72 are connected directly to grid 29. The cathode of tube 71 is returned to a +2 volt source. The anode of tube 72 goes to a −2 volt source. The provision of clamps 71 and 72 was found desirable in order to not overload grid 29.

Although the tubes in Fig. 1 have all been shown as separate tubes, it will be appreciated that certain of them may be of the so-called twin-element type. For example, tubes 11 and 12 may together be one tube of the 6SL7-GT type. Tubes 17 and 18 may together be a 6H6 type tube. Tubes 21 and 57 may together be a 6SN7-GT type tube. Tubes 23 and 24 may together be a 6H6 type tube; so also may tubes 59 and 60. Tubes 51 and 66 may together be a 6SN7-GT type tube. Tubes 30 and 31 may together be a 6SL7-GT type tube. Tubes 48 and 49 may together be a 6SN7-GT type tube. Tubes 71 and 72 may together be a 6H6 type tube.

Figure 2:
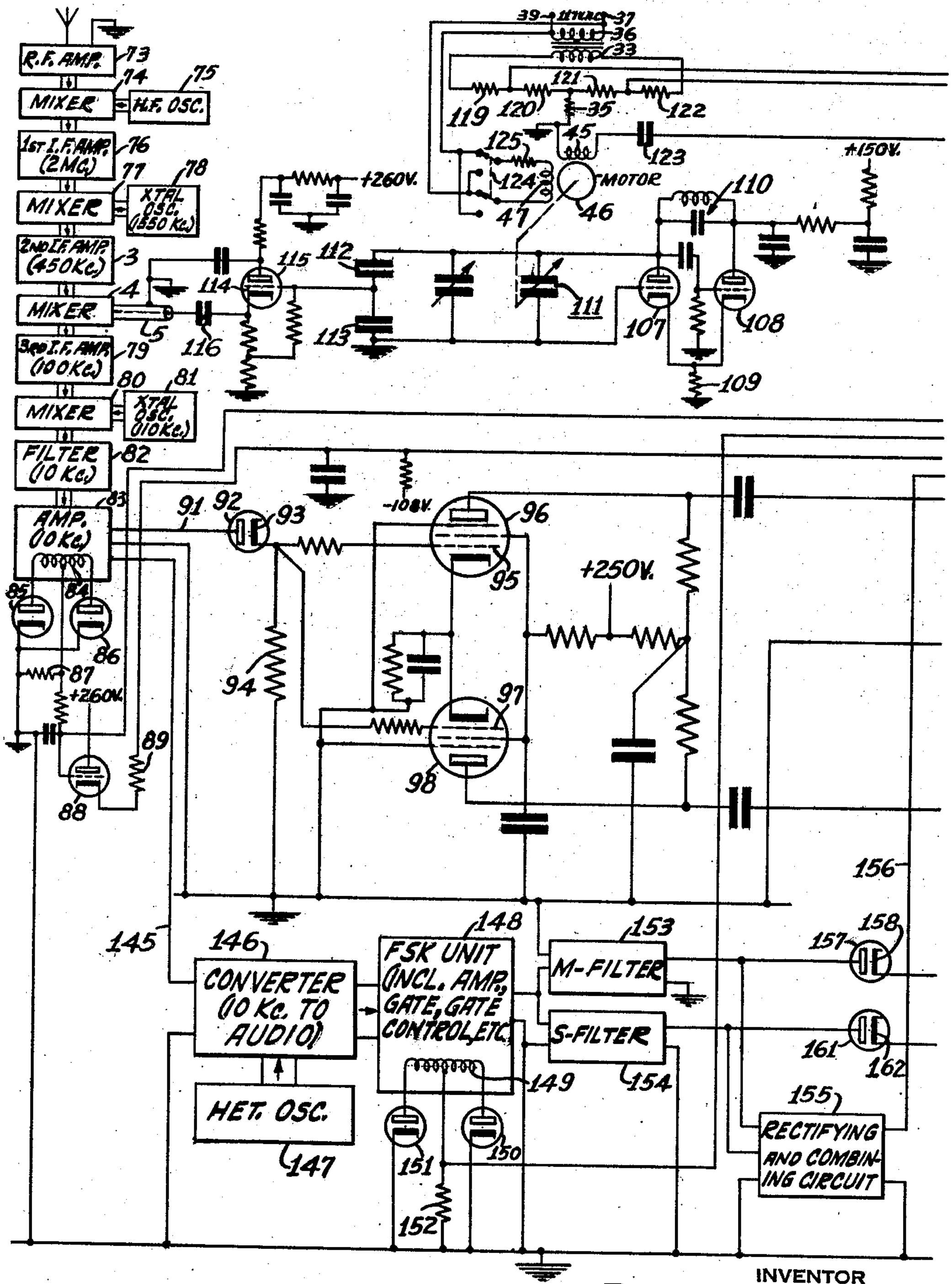
Fig. 2 (on two sheets) is a similar diagram of a modification.
Figure 2:
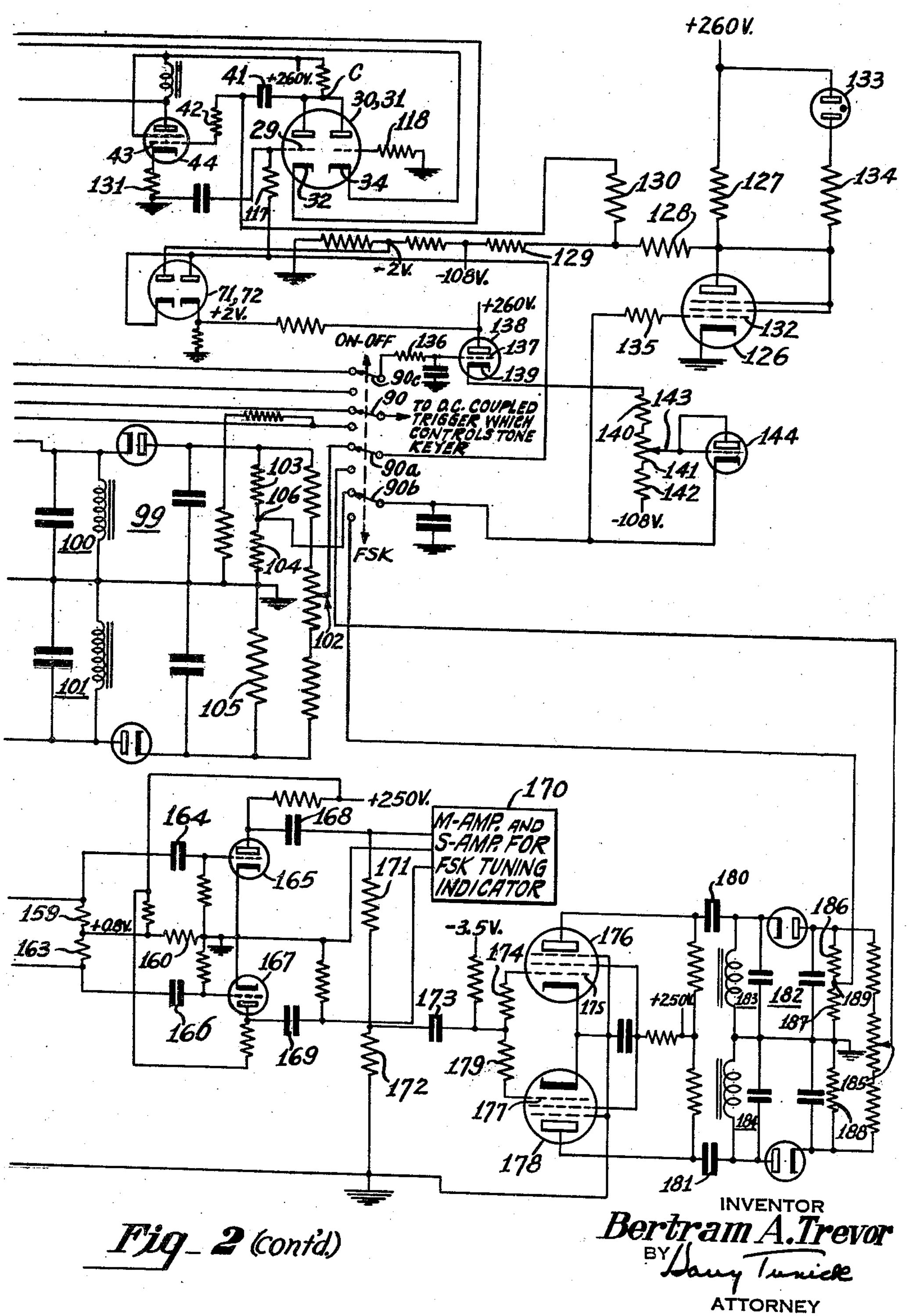

In Fig. 2 is disclosed a modified AFC system according to this invention. This figure illustrates, in general, an AFC circuit in conjunction with a single receiver. Actually, as will hereinafter appear, the AFC arrangement in a practical system, such as a three-set diversity system of my assignee's manufacture, would be controlled by, and would in turn control the tuning of, three separate receivers. For simplicity, the present description will cover operation with a single receiver, references being made from time to time, when necessary, to diversity reception. In Fig. 2, elements the same as those of Fig. 1 are denoted by the same reference numerals.

The transmited telegraph signals are picked up by an antenna and supplied to an RF amplifier 73 and thence to a mixer 74 where they are beaten down by signals supplied from an HF oscillator 75. The output of 74 is fed to a first intermediate frequency amplifier 76. The output of 76 is fed to a mixer 77 to which is also supplied heterodyning energy from a crystal oscillator 78. The output of 77 is fed to a second intermediate frequency amplifier 3. The output of 3 is fed to a mixer 4 to which are also supplied, by means of coaxial cable 5, oscillations from a 350-kc. oscillator to be later described. The frequency of this 350-kc. oscillator is controlled by the AFC system of this invention. The output of 4 is fed to a third intermediate frequency amplifier 79 working at 100 kc. The output of 79 is fed to a mixer 80 to which is supplied heterodyning energy from a crystal oscillator 81. The output of 80 is fed to a 10 kc. filter 82 and thence to a 10 kc. amplifier 83. Essentially, the output frequency of this amplifier 83 is to be maintained constant at 10 kc. by the AFC arrangement of the invention.

As will later become apparent, the AFC system of this invention may be used when receiving either on-off or FS keyed telegraph signals. The arrangement and operation for on-off keyed signals will first be described. Later, the arrangement and operation for FS keyed signals will be described.

84 indicates the secondary of a step-down transformer the primary of which is supplied by a cathode follower output stage of amplifier 83. Opposite ends of winding 84 are connected to the separate anodes of two on-off detector diodes 85 and 86. The cathodes of diodes 85 and 86 are grounded. The center tap on winding 84 is the connection to the common diode load resistor 87 one end of which is grounded. Also connected to resistor 87, but not shown, are diodes, similar to 85 and 86, in each of the other two receivers of a three-set diversity system. Diversity action, by diode switching, occurs between the three receivers as the stronger signal cuts off the weaker signal diodes. This is a more or less conventional arrangement for diversity switching.

The combined on-off diode rectifier output appears across 87 and is D. C. coupled to a cathode follower coupling tube 88. From the cathode of 88, a connection extends through resistor 89 to the "on-off" contact of a switch 90. Thence, with switch 93 in the position shown, the output signal is fed to a D. C. coupled trigger (not shown) which may control a tone keyer (not shown). The output of the tone keyer is fed to signal utilization apparatus, which might be located at a remote point. For example, if the receiver illustrated is located at Riverhead, Long Island, the signal utilization apparatus may be located in New York city.

Lead 91 is connected to an output point in amplifier 83 to feed such output to the anode of an AFC selector diode 92 the cathode 93 of which is connected through a resistor 94 to ground. Similar AFC selector diodes in the other two receivers of the three-set diversity system have their anodes fed from respective amplifiers (corresponding to amplifier 83) in such receivers. The cathodes of such other AFC selector diodes are connected directly to the cathode 93 and to the upper end of resistor 94. Through rectification, the instantaneous bias produced by the strongest signal tends to cut off the two weaker ones, thus keeping the AFC connected to the best signal at all times.

Cathode 93 is connected through a resistor to the control grid 95 of a pentode 96 and through a similar resistor to the control grid 97 of a pentode 98. The 10 kc. signal is amplified by tubes 96 and 98 and fed through coupling condensers to the on-off 10 kc. discriminator designated generally by numeral 99. Discriminator 99 is a somewhat modified Crosby double-tuned type unit. Discriminator 99 has two tuned circuits 100 and 101. Circuit 100 is peaked at 9.7 kc. Circuit 101 is peaked at 10.3 kc. The crossover is at 10 kc. Three series resistors, including a centrally-located potentiometric resistor having an adjustable tap 102 thereon, are connected between the anode of the upper discriminator diode and the cathode of the lower discriminator diode. The cathode of the upper diode is connected to the ungrounded end of circuit 100. The anode of the lower diode is connected to the ungrounded end of circuit 101. Tap 102 is connected to the "on-off" contact of a switch 90a ganged with switch 90. The on-off AFC center control 102 allows adjustment of the AFC center to exactly 10 kc.

Two resistors 103 and 104 are connected in series between the anode of the upper discriminator diode and ground. A resistor 105 is connected between the cathode of the lower discriminator diode and ground. From the common point 106 of resistors 103 and 104, a connection extends to the "on-off" contact of a switch 90b ganged with switch 90.

The discriminator 99 is driven by tubes 96 and 98, the tuned circuits 100 and 101 driving the two rectifiers. With 10 kc. input to tubes 96 and 98, both circuits drive the upper and lower diodes with equal voltages. This provides ground or zero potential at tap 102 and a negative potential at point 106. A slight change in frequency will still leave point 106 negative, but tap 102's direct potential will change in one direction or the other, according to the direction of the change in frequency.

The oscillator to be controlled in frequency consists of a pair of tubes 107 and 108 in a cathode-coupled type oscillator having a common cathode resistor 109. A tank circuit 110 is connected between the anodes of tubes 107 and 108. The oscillator tuning condenser 111, which is connected between the anode and grid of tube 107, is coupled through a suitable gear reduction train to the shaft of a two-phase motor 46. Motor 46 is in turn controlled by discriminators and threshold circuits to be described.

The oscillator output is fed from a capacitive voltage divider, consisting of condensers 112 and 113, to the grid 114 of a low impedance cathode follower coupling tube 115. The cathode of tube 115 is connected through condenser 116 to one conductor of coaxial line 5. In this way, the 350-kc. oscillatory energy is fed by line 5 to mixer 4, where it beats with the 450-kc. IF out of 3 to produce a 100-kc. output frequency.

The oscillator including tubes 107 and 108 can also supply ocsillatory energy of 350 kc. to two other receivers (not shown) of a three-set diversity system. For this purpose, two other cathode follower coupling tubes similar to tube 115 would be provided, one for each of the two other receivers of the diversity system. The grids of these other two coupling tubes would be connected directly in parallel to grid 114, to receive oscillatory energy from the oscillator, and a separate coaxial line similar to line 5 would be coupled to the cathode of each of these other two tubes, to feed oscillatory energy to a separate mixer similar to mixer 4 for each of the other two receiving channels of the three-set diversity system. In other words, the common oscillator feeds oscillatory energy into three separate cathode follower coupling tubes, one for each receiver of the three-set diversity system .

The AFC control for the tuning motor 46 is derived from the 10 kc. discriminator 99 when using on-off keying. With the keying selector switch 90, 90a, etc. in the position shown, the discriminator 99 is connected to serve as the AFC control. With switch 90a in the "on-off" position shown, the D. C. AFC potential at tap 102 is fed through a resistor 117 to one grid 29 of tube 30, 31. This tube may be of the 12AX7 type, a twin triode. Diode clamps 71, 72 are connected to the lower end of resistor 117 to prevent the AFC potential applied to grid 29 from exceeding ±2 volts. Clamps 71, 72 may together be a 6AL5 twin diode tube.

The other triode grid of 30, 31 is grounded through a resistor 118. Therefore, when the AFC voltage at tap 102 goes to zero at the crossover or center frequency of the discriminator 99, both grids of 30, 31 are at zero volts or ground potential. Across the secondary 33 of filament transformer 33, 36 are connected four series voltage divider resistors 119, 120, 121 and 122. The junction of resistors 119 and 120 is connected to cathode 32 while the junction of resistors 121 and 122 is connected to cathode 34. The midpoint junction between resistors 120 and 121 is connected to ground through resistor 35. In this way, 60-cycle voltages of opposite phase are supplied to the two cathodes 32 and 34. The two anodes of tube 30, 31 are connected directly together at point C. When the AFC voltage is zero, both grids of 30, 31 are at zero volts or ground potential and the 60-cycle voltages from transformer 33, 36 are amplified by both sides of 30, 31. These voltages, being of opposite phase, produce cancellation of the fundamental voltage at the common anode point C, leaving only some unbalanced harmonics.

Point C is connected through condenser 41 and resistor 42 to the grid 43 of amplifier tube 44. One winding 45 of two-phase tuning motor 46 is connected in the plate circuit of tube 44, one end of such winding being connected through a capacitor 123 to the plate of tube 44 and the other end of such winding being grounded. The other winding 47 of motor 46 is supplied from the 60-cycle terminals 37 and 39 through a reversing switch 124 and a resistor 125.

Under the above conditions, with proper receiver tuning, zero direct potential at tap 102 and no 60-cycle voltage at C, motor winding 45 is unenergized and the motor 46 does not rotate.

If a frequency change now occurs due to receiver tuning drift, the AFC voltage at tap 102 and at grid 29 will vary from zero. Let us assume first that it varies in a positive direction. It will vary in either a positive or negative direction according to the direction of frequency drift, from 10 kc., of the discriminator input signal. Under these conditions, the left-hand triode of 30, 31 will conduct more current and through common cathode resistor 35 will reduce the current in the right-hand triode of 30, 31.

The 60-cycle voltage on the left triode cathode will then be amplified by 30, 31 and 44 and be applied through condenser 123 to motor winding 45. This voltage will have a phase difference of 90 degrees from the voltage in winding 47, due to capacitor 123, and the motor 46 will therefore run. Tuning condenser 111 will be rotated to vary the frequency of oscillator 107, 108, etc. until its frequency is such as to bring the discriminator input signal to exactly 10 kc. In other words, the motor will run until the frequency of the oscillator is such as to restore 30, 31 to a balanced condition, with zero voltage at tap 102 and grid 29.

A frequency change giving an opposite polarity voltage at 102 produces a negative voltage at grid 29, resulting in conduction of the right-hand triode of 30, 31. Due to the 180° phase difference of the 60-cycle voltage applied to the cathodes 32 and 34, this results in an output voltage at C 180° different in phase from the former example, reversing the rotation of motor 46. This will cause rotation of 111 in the opposite direction to bring the discriminator input frequency back to exactly 10 kc.

The foregoing has described the operation of the AFC system for on-off telegraph signals, switch 90, 90*a*, etc. being in the "on-off" position.

To prevent false AFC operation on weak signals or on a signal that momentarily fades into the noise level, a threshold system is provided. This system biases off the AFC amplifier tube 44 under these conditions. Tube 126 is the cut-off control tube. A voltage divider, consisting of series resistors 127, 128 and 129, is connected between a +260 volt source and a −108 volt source. Resistor 127 is the plate resistor of tube 126. From the junction point of resistors 128 and 129, a connection extends through resistor 130 and resistor 42 to grid 43. Thus, at least a portion of the grid bias of tube 44 is obtained from voltage divider 127—129, it being noted that there is a resistor 131 between the cathode of tube 44 and ground.

When tube 126 has more than about −4 volts on its control grid 132 (the cathode of tube 126 being grounded), this tube is cut off. Then, the voltage divider 127—129 provides normal operating bias on AFC amplifier tube 44. A neon lamp 133 is connected in series with a protective resistor 134 across resistor 127. When tube 126 is cut off, there is insufficient voltage drop across 127 to light lamp 133 and this indicator light being off shows that the AFC circuits are normal.

Grid 132 derives its cutoff bias of about −15 volts from point 106 on the negative output side of discriminator 99, through switch 90*b* and resistor 135. Therefore, with normal on-off keying, 126 is always at cutoff. If the signal becomes very weak, the negative voltage at discriminator point 106 drops, to make 126 conduct. When 126 conducts, the positive voltage at the high end of resistor 128 is reduced, thus leaving a net negative bias on grid 43. This will cut off tube 44 and make the motor 46 stop. The AFC is then disabled. Under this condition, the drop across resistor 127 is sufficient to light indicator lamp 133. This indicates that the AFC is off.

With very slow on-off keying, the cutoff voltage from the discriminator 99 will alternate between −15 volts and a lower value. This will make the indicator light 133 blink. Long time constants in the discriminator and in the cut-off control circuits minimize this condition.

The receiver of this invention has a rather large automatic gain control (AGC) range. The AGC circuits have not been shown, in order to simplify the drawings as much as possible. Due to the large AGC range of the receiver, the noise output at the discriminators tends to be high under weak signal or no-signal conditions, resulting in the control tube 126 sometimes operating to the AFC "on" condition (tube 126 cut off) with noise. An additional threshold circuit is provided to squelch or disable the AFC under this condition.

A control voltage is derived from the on-off diodes 85 and 86 by means of a connection extending from the grid of tube 88 to the "on-off" contact of a switch 90*c*, ganged with switch 90. With switch 90*c* in the position shown, this voltage is applied through a resistor 136 to the control grid of a triode 138. Tube 138 is connected to operate as a cathode-coupled D. C. amplifier. The cathode 139 of tube 138 is connected through a series-resistor voltage divider 140, 141, 142 to the −108 volt supply. 141 is the AFC threshold potentiometer which is set with a signal in the receiver to the point where the AFC indicator light 133 just goes out, indicating normal AFC circuits. The movable tap 143 on 141 is connected to the grid and plate of a diode-connected triode 144 the cathode of which is connected to the switch end of resistor 135. Hereafter, tube 144 will be termed a diode.

When the tap 143 is set to a point where indicator 133 just goes out with a signal in the receiver, the diode 144 is cut off (nonconducting). Then, it has no effect on the grid 132 of tube 126. A time constant circuit (not shown) at the grid of tube 88 provides AGC action for the receiver. If the on-off signal goes to "off" long enough to allow said circuit to discharge and if the accompanying rise in gain due to the AGC action produces more than −4 volts of noise at the discriminator 99, then the AFC would run on noise and detune the receiver. However, the on-off diodes 85, 86 under this condition produce at the grid of tube 88 only −10 volts of noise as against −15 volts with a normal signal.

The resulting change from −15 to −10 volts through tube 138 causes diode 144 to conduct. This clamps the grid 132 of tube 126 to a low negative potential, causing such tube to conduct. This in turn squelches or disables the AFC until the on-off signal again is keyed or recovers sufficiently above the noise level. When this occurs, diode 144 no longer conducts and tube 126 is again cut off.

The foregoing has described the operation of the Fig. 2 system in connection with on-off keyed signals. There remains to be described the operation when receiving FSK signals.

Lead 145 is connected to an output point in amplifier 83 to feed such output to a converter unit 146. This converter or mixer is also fed oscillatory energy from an oscillator 147 and functions to convert the FSK signal from the last IF of 10 kc. down to audio frequencies to fit the mark and space filters.

The output of 146 is fed to an FSK unit 148. This unit may be of the type disclosed in my copending application, Serial No. 106,465, filed July 23, 1949, for example. Said copending application ripened on November 25, 1952 into Patent #2,619,587. It may include amplifiers, gate tubes, gate control circuits, etc., and may function to select for the output of the unit the strongest signal of a three-receiver diversity system. 149 indicates the secondary of a transformer the primary of which is supplied by a cathode follower amplifier stage in unit 148. Opposite ends of winding 149 are connected to the separate anodes of two FSK system diodes 150 and 151. The cathodes of these diodes are grounded. The center tap on winding 149 is the connection to the common FSK diode load resistor 152 one end of which is grounded. The diodes 150 and 151 aid in the diversity switching action, and may correspond to one of the diodes 14, 20 or 24 in my copending application referred to. A connection extends from the ungrounded end of resistor 152 to the "FSK" contact of switch 90*c*, for a purpose to be later described. The mark-space signal at the output of unit 148 is fed to the common inputs of a mark filter 153 and a space filter 154. The individual mark and space filter outputs are fed to separate mark and space amplifiers (not shown, but as disclosed in my said application). From thence they are fed to a common rectifying and combining circuit 155. In 155 they are rectified and combined in such a way as to produce D. C. keying at output lead 156, for "mark" −3 volts to ground and for "space" +3 volts to ground. 155 may be arranged as disclosed in my said application. Lead 156 is connected to the "FSK" contact of switch 90. When switch 90 is in the "FSK" position, the D. C. keying at lead 156 is fed to the D. C. coupled trigger which controls the tone keyer. In this way, the received FSK signals may be utilized.

The audio output of mark filter 153 is fed to the anode of an AFC mark selector diode 157 the cathode 158 of which is connected through a resistor 159 to a bias potential of +0.8 volt and through another resistor 160 to ground. Similar AFC mark selector diodes in the other two receivers of the three-set diversity system have their anodes fed from respective mark filters (corresponding to filter 153) in such receivers. The cathodes of such other AFC mark selector diodes are connected directly to the cathode 158 and to the upper end of resistor 159. Through rectification, the instantaneous bias produced by the strongest signal tends to cut off the two weaker ones, thus keeping the AFC connected to the best signal at all times. The action here is substantially as disclosed in my copending application, Serial No. 154,650, filed 7, 1950, which ripened on October 7, 1952 into Patent #2,613,271.

Similarly, the audio output of space filter 154 is fed to the anode of an AFC space selector diode 161 the cathode 162 of which is connected through a resistor 163 to a bias potential of +0.8 volt and to the ungrounded end of resistor 160. Similar AFC space selector diodes in the other two receivers of the three-set diversity system have their anodes fed from respective space filters (corresponding to filter 154) in such receivers. The cathodes of such other AFC space selector diodes are connected directly to the cathode 162 and to the lower end of resistor 163. Through rectification, the instantaneous bias produced by the strongest signal tends to cut off the two weaker ones, thus keeping the AFC connected to the best signal at all times. Here, again, the action is substantially as disclosed in my copending application, Serial No. 154,650.

Cathode 158 is connected through a coupling condenser 164 to the control grid of a triode 165 which amplifies the mark frequency. Cathode 162 is connected through a coupling condenser 166 to the control grid of a triode 167 which amplifies the space frequency. The anode of tube 165 is connected through a coupling condenser 168 to a unit 170 in order to apply the output of such tube thereto. The anode of tube 167 is connected through a coupling condenser 169 to unit 170. Unit 170 consists of a mark amplifier and a space amplifier for an FSK tuning indicator, preferably arranged as shown in my copending application, Serial No. 154,650.

A voltage divider, consisting of two series resistors 171 and 172, is connected between the unit 170 side of condenser 168 and ground. The mark frequency is fed to control grid 175 of discriminator driver tube 176 by means of a connection from the junction of resistors 171 and 172 through condenser 173 and resistor 174. The mark frequency is also fed from the voltage divider to control grid 177 of another discriminator driver tube 178 through condenser 173 and resistor 179. The mark frequency signal is amplified by tubes 176 and 178 and fed through coupling condensers 180 and 181 to the discriminator 182. Discriminator 182 is a somewhat modified Crosby double-tuned-type unit, similar to discriminator 99. Discriminator 182 has two tuned circuits 183 and 184. Discriminator 182 has a center frequency corresponding to the audio frequency of the received mark signal which should appear, when the receiver is properly tuned, at the output of converter or mixer 146. As a typical example, discriminator 182 may have a center frequency of 2125 cycles.

Three series resistors, including a centrally-located potentiometric resistor having an adjustable tap 185 thereon, are connected between the anode of the upper discriminator diode and the cathode of the lower discriminator diode. The cathode of the upper diode is connected to condenser 180 and to the ungrounded end of circuit 183. The anode of the lower diode is connected to the condenser 181 and to the ungrounded end of circuit 184. Tap 185 is connected to the "FSK" contact of switch 90*a*. At a predetermined center frequency, the crossover or AFC center is adjustable by 185. This enables obtaining of zero D. C. output for a considerable range of mark frequencies about the 2125-cycle position of the discriminator 182. Thus, taking into consideration the characteristics of filters 153 and 154, with the various amounts of frequency shift usable at the corresponding filter center frequencies, the AFC may be adjusted to control at any desired mark frequency.

Two resistors 186 and 187 are connected in series between the anode of the upper discriminator diode and ground, while a resistor 188 is connected between the cathode of the lower discriminator diode and ground. From the common point 189 of resistors 186 and 187 a connection extends to the "FSK" contact of switch 90*b*.

The discriminator 182 is driven by tubes 176 and 178, the tuned circuits 183 and 184 driving the two rectifiers. If the discriminator 182's center frequency is 2125 cycles, with a 2125-cycle mark input to tubes 176 and 178 both circuits drive the upper and lower diodes with equal voltages. This provides zero or ground potential at tap 185 and a negative potential at point 189. A slight change in mark frequency will still leave point 189 negative, but tap 185's direct potential will change in one direction or the other, according to the direction of the change in frequency.

The AFC control for the tuning motor 46 is derived from the 2125-cycle discriminator 182 when using FS keying. With the keying selector switch 90, 90*a*, etc. in the "FSK" position, the discriminator 182 is connected to serve as the AFC control. With switch 90*a* in the "FSK" position, the D. C. AFC potential at tap 185 is fed through resistor 117 to grid 29. When the AFC voltage at tap 185 goes to zero at the crossover or center frequency of the discriminator 182, both grids of 30, 31 are at ground potential. Under these conditions, motor winding 45 is not energized and motor 46 does not rotate.

The operation of the AFC, when controlled from the discriminator 182, is exactly the same as when controlled from the discriminator 99. The description of such operation therefore will not be repeated. Suffice it to say here that the frequency of the 350-kc. oscillator will be varied by motor 46 to maintain the input signal to discriminator 182 exactly at the discriminator center frequency of 2125 cycles or at any predetermined nearby frequency corresponding to the setting of tap 185.

With switch 90, 90$a$, etc. in the "FSK" position, the threshold system including tube 126 is again effective to bias off AFC amplifier tube 44 under conditions of a weak signal or one that momentarily fades into the noise level. Grid 132 of tube 126 then derives its cutoff bias of about —15 volts from point 189 on the negative output side of the 2125-cycle discriminator 182, through switch 90$b$ and resistor 135. With normal FS keying, 126 is always at cutoff. If an FSK signal stops on space, the control voltage at 189 goes to zero or slightly positive, causing 126 to conduct. This reduces the positive voltage at the high end of resistor 128, leaving a net negative bias on grid 43 and cutting off 44. This will make the motor 46 stop, disabling the AFC. Also, indicator lamp 133 will be lighted, indicating that the AFC is off.

With switch 90, 90$a$, etc. in the "FSK" position, the additional threshold circuit including diode 144 is again effective to prevent the AFC running on noise.

A control voltage is derived from the FSK diodes 150 and 151 by means of a connection extending from the ungrounded end of resistor 152 to the "FSK" contact of switch 90$c$. With switch 90$c$ in the "FSK" position, this voltage is applied through 136 to the control grid of 138. If the FSK signal goes off the air or fades to a very weak signal, the diodes 150 and 151 produce at the ungrounded end of 152 only —6.1 volts of noise as against —9.6 volts with a normal signal, since the FSK limiter follows the diode drive circuits. The resulting change from —9.6 to —6.1 volts through tube 138 causes diode 144 to conduct. This clamps grid 132 to a low negative potential, causing tube 126 to conduct. This again squelches or disables the AFC until the FSK signal again appears or recovers sufficiently above the noise level. When this occurs, diode 144 no longer conducts and tube 126 is again cut off.

It should be noted that the input to driver tubes 176 and 178 of discriminator 182 is taken from mark amplifier tube 165. Therefore, as long as there is a mark signal present to pass through mark filter 153, tube 126 is cut off. The AFC is then enabled. In other words, the AFC system will continue to function if the signal stops on mark, a condition commonly occurring with printer operation. The circuit of Fig. 1 does not have this feature.

As previously explained, with FSK and AFC system of Fig. 2 is disabled if the signal stops on space or stops keying. With FSK, the AFC system of Fig. 1 is disabled only when keying stops.

Although in Fig. 2 the tubes have been illustrated in most cases as separate, it is to be understood that this is not absolutely essential. Pairs of electrode structures of Fig. 2 may be combined in single envelopes, in tubes of the so-called twin-element type. Examples of the latter which may be used are: 6AL5, 12AU7 and 12AX7.

Figure 3:
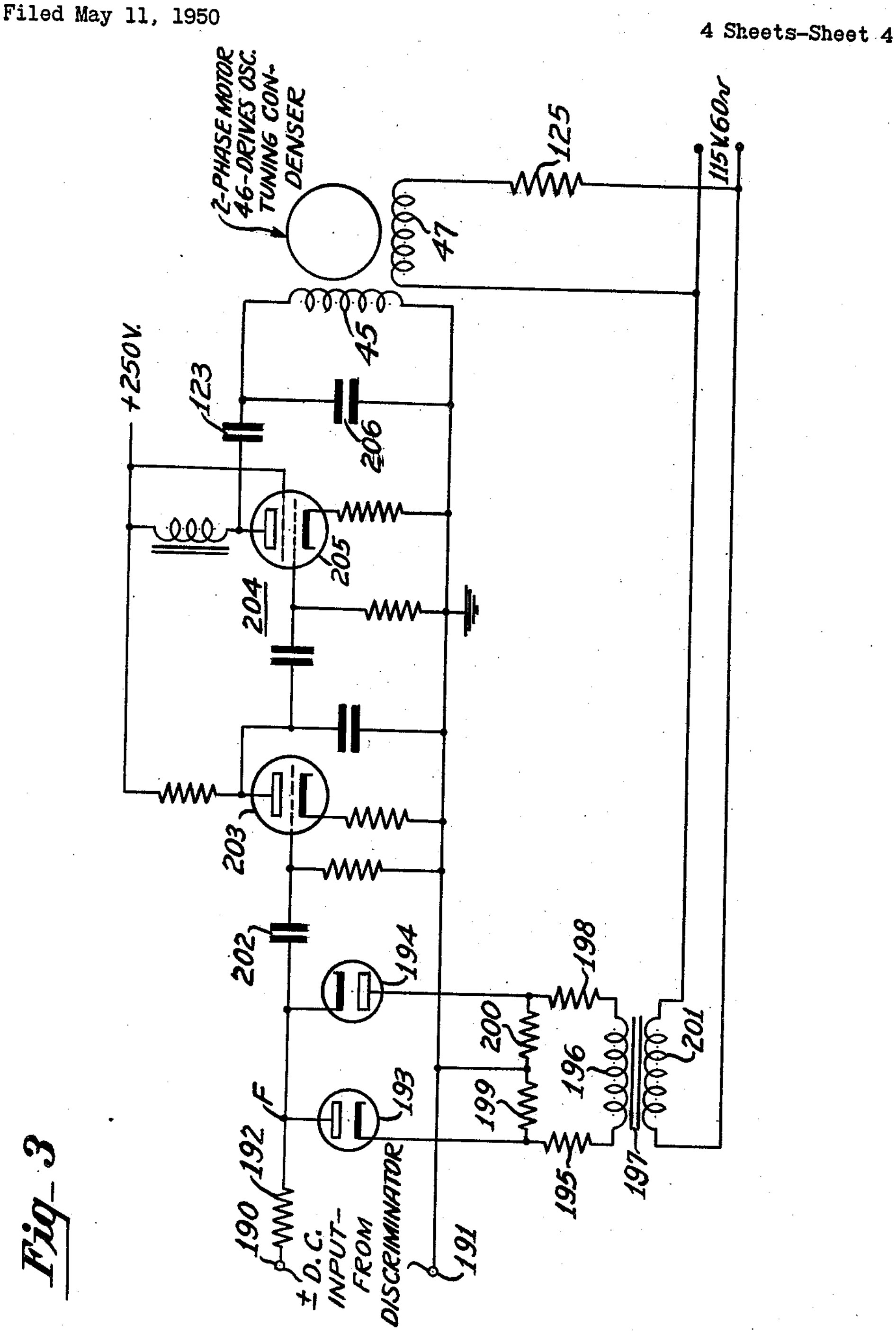
Fig. 3 is a schematic diagram of a modified motor control circuit.

Fig. 3 discloses a modified AFC motor control circuit. This figure is somewhat simplified as compared to Figs. 1 and 2. In Fig. 3, elements the same as those of Figs. 1 and 2 are denoted by the same reference numerals. The direct current output of a discriminator or other suitable source is applied as input to the terminals 190 and 191 of the AFC system. Terminal 191 is grounded. The direct potential at terminal 190 may be either plus or minus with respect to ground 191, depending on the direction of variation of the discriminator input frequency with respect to a predetermined desired frequency. The magnitude of such potential at 190 depends upon the amount of frequency error. This is the well-known operation of a discriminator.

Terminal 190 is connected through a resistor 192 to point F and the anode of a diode 193 and to the cathode of a diode 194. In this way, potentials at 190 are applied to the anode of 193 and to the cathode of 194. Diodes 193 and 194 are also fed with alternating current. This is effected by a connection from the cathode of 193 through resistor 195 to one end of the secondary 196 of alternating current input transformer 197 and by a connection from the anode of 194 through a resistor 198 to the other end of secondary 196. Two equal resistors 199 and 200 are connected in series between the cathode of 193 and the anode of 194. The common junction of these two resistors is grounded. The primary 201 of transformer 197 is connected to a suitable source of alternating current, such as the ordinary 115-volt, 60-cycle source. Resistor 192 is very large as compared to resistor 195, 198, 199 and 200.

Point F is connected through a coupling condenser 202 to the control grid of the first tube 203 of a two-stage condenser-coupled amplifier denoted by numeral 204. Amplifier 204 is a more or less conventional voltage amplifier, amplifying the voltages appearing at point F. The anode output of the second-stage tube 205 is coupled through a phasing condenser 123 to one of the motor windings 45 of a two-phase motor 46. Winding 45 may be described as the controlled motor winding. A capacitor 206 is connected across winding 45 to tune the same to resonance at 60 cycles, thus providing a parallel resonant circuit in the output of amplifier 204.

The other winding 47 or motor 46 is connected through a resistor 125 to the same source of alternating current used to supply primary winding 201. Winding 47 is therefore constantly energized. The shaft of motor 46 drives the tuning condenser of a heterodyne oscillator (not shown) which governs the frequency of the input to the same discriminator to the output side of which terminals 190 and 191 are connected.

First assume that there is zero direct current potential at terminals 190 and 191. In other words, assume that terminal 190 is also at ground potential. There would be zero direct potential at the output of the discriminator, to which terminals 190 and 191 are connected, when the receiver is properly tuned. Under these conditions, motor 46 should be unenergized. During the half of the A. C. cycle in which the right-hand end of 196 is positive and the left-hand end thereof negative, diodes 193 and 194 both conduct in series (through resistors 195 and 198). The diodes are so poled that they will conduct in series during this half-cycle. During the other half of the A. C. cycle, in which the right-hand end of 196 is negative and the left-hand end thereof positive, the diodes 193 and 194 are both nonconducting. The diodes are so poled that they are nonconducting during this other half-cycle.

During the periods of diode conduction, point F is clamped to ground, since the resistors 195 and 198 are equal and since in effect the center of winding 196 is grounded (resistors 199 and 200 being equal). During the periods of diode nonconduction, point F immediately assumes the voltage at the input terminal 190, since there is then no load from F to ground. Point F then assumes the D. C. input potential for one half of each complete cycle of the 60-cycle drive.

With zero D. C. input at terminals 190—191, then, point F remains steadily at zero or ground and no A. C. is passed to amplifier 204. Motor winding 45 is unenergized under these conditions, such winding being supplied only by amplifier 204's output. The receiver is then properly tuned and the AFC is inactive.

Since resistor 192 is a great deal larger than resistors 195 and 198, a small D. C. voltage at the input 190—191 cannot change the voltage at F by an appreciable amount, during the periods of diode conduction. Point F is, therefore, clamped to ground during one-half of each complete cycle of the 60-cycle drive, regardless of the D. C. input potential. Therefore, even when the receiver is improperly tuned, when there is an appreciable direct potential at the receiver's discriminator's output, during periods of diode conduction point F is at ground or zero potential.

As previously described, point F immediately assumes the voltage at the input terminals during the periods of diode nonconduction. Therefore, with a positive D. C. input voltage at 190—191, point F will alternate between this positive D. C. voltage and ground at a 60-cycle rate. With a negative D. C. input voltage, point F will alternate this negative D. C. voltage and ground at a 60-cycle rate.

Amplifier 204 is capacitively coupled (at 202) to the diode chopper 193, 194 etc. Hence, only the 60-cycle A. C. component is amplified and fed to motor winding 45. Therefore, when the receiver is improperly tuned, there is a direct potential at 190—191 and 60-cycle A. C. is fed to motor winding 45. Winding 47 being continuously supplied with 60-cycle A. C. from the line, motor 46 will now be energized and will rotate to change the receiver's tuning. Therefore, the AFC will be active to properly tune the receiver.

With a positive D. C. input at 190—191, point F alternates between this positive voltage and ground; with a negative D. C. input, point F alternates between this negative voltage and ground. Therefore, the phase of the A. C. applied to the grid of tube 203 reverses when the D. C. input potential goes from positive to negative. The verity of this statement should be apparent to those skilled in the art. Hence, motor 46 will run one way with positive D. C. input at 190—191 and the other way with negative D. C. input. The AFC action of the tuning motor arrangement of Fig. 3 will therefore be proper.

The voltage excursion of F relative to ground cannot exceed one-half the peak-to-peak value of the transformer A. C. voltage, due to the clamping action of the diodes. Thus, when F tends to go too far negative relative to the negative voltage on the anode of diode 194 (this negative voltage on such anode being present during periods of diode nonconduction), this diode will conduct to clamp F to ground. When F tends to go too far positive, diode 193 will conduct to clamp F to ground. This action has the effect of limiting the maximum A. C. voltage that can be applied to the input of amplifier 204. This limiting is desirable, to prevent overload. In other words, during half-cycles of the A. C.) of diode nonconduction, point F assumes the D. C. potential of the input, as long as this D. C. potential does not exceed the peak value of the A. C. applied to the diodes.

The circuit of Fig. 3, including the 60-cycle resonant circuit 45, 206, is arranged to improve the wave form of the rather square waves or pulses applied to the amplifier 204. It also provides (due in part to capacitor 123 and to the choke in the plate lead of tube 205) the required 90° phase relation between the voltages applied to the two motor windings 45 and 47.

What I claim to be my invention is as follows:

1. An automatic frequency control system, comprising means, to which signals are fed, for utilizing such signals, tunable means for controlling the frequency of the signals fed to said utilizing means, a two-phase motor having two field windings and having an armature coupled to said tunable means to vary the tuning thereof, a source of alternating current coupled to one field winding, a pair of electron discharge devices having input, output and control electrodes, connections for applying alternating current from said source antiphasally to corresponding input electrodes of each of said devices, a connection between the output electrodes of both said devices and the other field winding, means coupled to said utilizing means for deriving a potential which varies with respect to a reference value in response to variations of the frequency of said signals from a predetermined value, and means for applying said potential to the control electrode of one of said devices.

2. An automatic frequency control system, comprising an amplifier to which signals are fed, a tunable heterodyne oscillator for controlling the frequency of the signals fed to said amplifier, a two-phase motor having two field windings and having an armature coupled to said oscillator to vary the tuning thereof, a source of alternating current coupled to one field winding, a pair of electron discharge devices having input, output and control electrodes, connections for applying alternating current from said source antiphasally to corresponding input electrodes of each of said devices, a connection between the output electrodes of both said devices and the other field winding, means coupled to said amplifier for deriving a potential which varies with respect to a reference value in response to variations of the frequency of said signals from a predetermined value, and means for applying said potential to the control electrode of one of said devices.

3. An automatic tuner for frequency shift keyed or on-off keyed telegraphy, comprising means, to which telegraph signals are fed, for utilizing such signals, tunable means for controlling the frequency of the signals fed to said utilizing means, a frequency discriminator detector coupled to said utilizing means, said discriminator detector including circuits tuned respectively above and below the desired signal frequency and rectifiers coupled in opposed relation by rectifier loads, apparatus for tuning said tunable means, connections to said loads for deriving the difference of the potentials developed across such loads, means for controlling said apparatus by said difference potential, and means connected to said loads and responsive to the absence of at least one of the potentials developed across such loads for disabling said apparatus in the absence of keyed signals.

4. An automatic tuner for frequency shift keyed or on-off keyed telegraphy, comprising means, to which telegraph signals are fed, for utilizing such signals, tunable means for controlling the frequency of the signals fed to said utilizing means, a frequency discriminator detector coupled to said utilizing means, said discriminator detector including circuits tuned respectively above and below the desired signal frequency and rectifiers coupled in opposed relation by rectifier loads, apparatus for tuning said tunable meas, connections to said loads for deriving the difference of the potentials developed across such loads, means for controlling said apparatus by said difference potential, a controllable current conducting path connected in series with said apparatus, and means coupled to said loads and responsive to the absence of at least one of the potentials developed across such loads for controlling said path to disable said apparatus in the absence of keyed signals.

5. An automatic tuner for frequency shift keyed or on-off keyed telegraphy, comprising an amplifier to which telegraph signals are fed, a tunable heterodyne oscillator for controlling the frequency of the signals fed to said amplifier, a freqeuncy discriminator detector coupled to said amplifier, said discriminator detector including circuits tuned respectively above and below the desired signal frequency and rectifiers coupled in opposed relation by rectifier loads, apparatus including a controllable tuning motor for varying the tuning of said oscillator, conections to said loads for deriving the difference of the potentials developed across such loads, means for controlling said motor by said difference potential, and means connected to said loads and responsive to the absence of at least one of the potentials developed across such loads for disabling said apparatus in the absence of keyed signals.

6. An automatic tuner for frequency shift keyed or on-off keyed telegraph signals, comprising means, to which telegraph signals are fed, for utilizing such signals, tunable means for controlling the frequency of the signals fed to said utilizing means, a frequency discriminator detector coupled to said utilizing means, said discriminator detector including circuits tuned respectively above and below the desired signal frequency and retifiers coupled in opposed relation by rectifier loads, apparatus for tuning said tunable means, said apparatus being coupled for energization thereof to a source of alternating current, connections to said loads for deriving the difference of the potentials developed across such loads, means for controlling said apparatus by said difference potential, a controllable amplifier device between said source and said apparatus, means coupled to said loads and responsive to the absence of at least one of the potentials developed across such loads for cutting off said device to disable said apparatus in the absence of keyed signals, and additional means, responsive to the presence in said utilizing means of signals below a predetermined strength, for cutting off said device to disable said apparatus.

7. An automatic tuner for frequency shift keyed or on-off keyed telegraph signals, comprising an amplifier to which telegraph signals are fed, a tunable heterodyne oscillator for controlling the frequency of the signals fed to said amplifier, a frequency discriminator detector coupled to said amplifier, said discriminator detector including circuits tuned respectively above and below the desired signal frequency and rectifiers coupled in opposed relation by rectifier loads, apparatus for varying the tuning of said oscillator, said apparatus being coupled for energization thereof to a source of alternating current, connections to said loads for deriving the difference of the potentials developed across such loads, means for controlling said apparatus by said difference potential, a controllable amplifier device between said source and said apparatus, means coupled to said loads and responsive to the absence of at least one of the potentials developed across such loads for cutting off said device to disable said apparatus in the absence of keyed signals, and additional means, responsive to the presence in said first-mentioned amplifier of signals below a predetermined strength, for cutting off said device to disable said apparatus.

8. An automatic frequency control system for frequency shift keyed telegraph signals in which two signal frequencies are alternatively present, one of said frequencies representing space and the other, mark, comprising means, to which telegraph signals are fed, for utilizing such signals, tunable means for controlling the frequency of the signals fed to said utilizing means, means coupled to said utilizing means for deriving a potential which varies with respect to a reference value in response to variations of the mean frequency of said signals from a predetermined value, apparatus controlled by said potential for tuning said tunable means to change the means frequency of said signals back to said predetermined value, and means responsive to a potential at the output of said potential deriving means for disabling said apparatus if keying of the telegraph signal stops on a predetermined one of said two signal frequencies.

9. A system in accordance with claim 8, wherein the predetermined one of the two signal frequencies is that representing space.

10. In an automatic control system for radio apparatus having a mechanically-driven control member, a two-phase motor having two field windings and having an armature mechanically coupled to said member to drive the same, a source of alternating current coupled to one field winding, a pair of electron discharge devices having input, output and control electrodes, connections for applying alternating current from said source antiphasaly to corresponding input electrodes of each of said devices, a connection between the output electrodes of both said devices and the other field winding, and means for varying the potential on the control electrode of one of said devices.

BERTRAM A. TREVOR.

References Cited in the file of this patent

UNITED STATES PATENTS

| Number | Name | Date |
|---|---|---|
| 1,993,581 | Alexanderson | Mar. 4, 1935 |
| 2,123,716 | Crosby | July 12, 1938 |
| 2,489,637 | Hand | Nov. 29, 1949 |
| 2,513,786 | Crosby | July 4, 1950 |
| 2,541,128 | Violet | Feb. 13, 1951 |
| 2,567,896 | Semm | Sept. 11, 1951 |